United States Patent [19]

Zobawa

[11] 4,232,929
[45] Nov. 11, 1980

[54] MULTI-ROW PLUG CONNECTOR WITH A FITTED SHIELD PLATE

[75] Inventor: Franz Zobawa, Munich, Fed. Rep. of Germany

[73] Assignee: Siemens Aktiengesellschaft, Berlin & Munich, Fed. Rep. of Germany

[21] Appl. No.: 58,484

[22] Filed: Jul. 18, 1979

[30] Foreign Application Priority Data

Jul. 21, 1978 [DE] Fed. Rep. of Germany ....... 2832243

[51] Int. Cl.³ .............................................. H01R 3/06
[52] U.S. Cl. ............................ 339/143 R; 339/17 LC; 339/177 R; 339/14 R
[58] Field of Search ........ 339/17 LC, 17 LM, 143 R, 339/176 MP, 177 R, 177 A, 14 R, 14 L, 14 P

[56] References Cited

U.S. PATENT DOCUMENTS

| | | | |
|---|---|---|---|
| 3,509,513 | 4/1970 | Russin | 339/143 R X |
| 3,662,318 | 5/1972 | Dacuyper | 339/177 R |
| 4,012,095 | 3/1977 | Doucet | 339/177 R X |
| 4,070,084 | 1/1978 | Hutchison | 339/143 R |
| 4,094,564 | 6/1978 | Cheolici | 339/14 L |
| 4,130,934 | 12/1978 | Asick et al. | 339/14 R X |

FOREIGN PATENT DOCUMENTS 7708125  6/1977  Fed. Rep. of Germany .
486412  12/1975  U.S.S.R. .................... 339/14 R Primary Examiner—Howard N. Goldberg
Assistant Examiner—Eugene F. Desmond
Attorney, Agent, or Firm—Hill, Van Santen, Steadman, Chiara & Simpson

[57] ABSTRACT

A pin strip is disclosed for a multi-row plug connector for transmitting small signals with low crosstalk in data processing systems with intermeshed ground planes which are in each case arranged between signal planes. Between at least one row of pins which forms a signal plane and an adjoining row of pins which forms a ground plane there is a shield plate spring clamped in position whose edges are bent inwardly and which contact all the pins of the ground plane. An insulating film is provided to insulate the plate from the signal plane pins.

8 Claims, 1 Drawing Figure

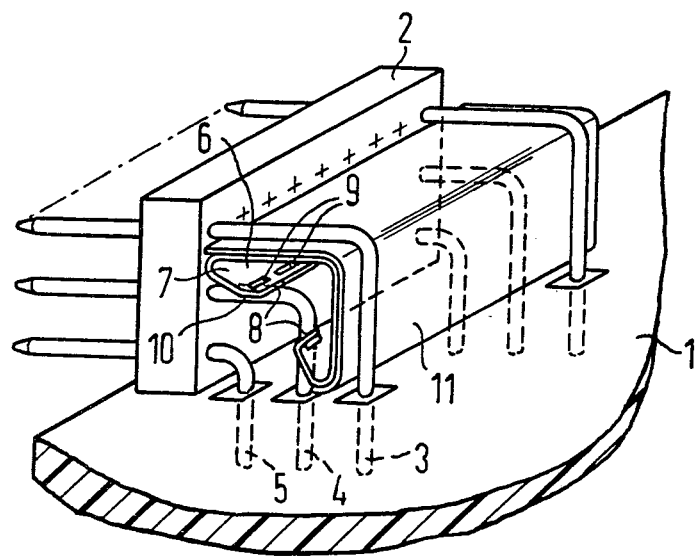

MULTI-ROW PLUG CONNECTOR WITH A FITTED SHIELD PLATE

BACKGROUND OF THE INVENTION

The invention relates to a pin strip for a multi-row plug connector for transmitting small signals with low crosstalk in data processing systems. Intermeshed ground planes are arranged between signal planes.

The current high packing density achieved with respect to electrical components on circuit boards has led to the need for lines which supply ground and the signals to likewise exhibit a high packing density. These lines must be designed in such manner that the quality of the overall transmission link from the transmitter to the receiver is not fundamentally impaired. In particular, when these lines are used to transmit digital signals, the transmission quality is subject to special requirements. The transmission quality is reduced by mismatching and in particular by excessive crosstalk from one signal wire to another. Close crosstalk, which is particularly disturbing, occurs at junction points, such as for example plug connectors.

In order to avoid this close crosstalk it is known (German Utility Patent 77 08 135 incorporated herein by reference) to use three-row connecting plugs in which an internal, intermeshed ground plane is arranged between two outer signal planes.

The screening effect of connecting plugs of this type is primarily manifested, however, in conjunction with so-called stranded spiral quads in which two conductors arranged opposite one another serve as signal conductors and the other two conductors as ground conductors. If the pin strips of the connecting plugs are secured to the circuit boards by angular pins, the free unscreened length of the outer row of signal pins leads to an impairment in the transmission characteristics of the connecting plug.

SUMMARY OF THE INVENTION

An object of the invention is, in multi-row plug connectors with a pin and spring-strip for the transmission of small signals in data processing systems, to make available pin strips which are sufficiently resistant to interference radiation, exhibit low crosstalk from one line to another, and can be economically produced and processed while maintaining good mechanical properties. The plug connector is in particular to be designed so that it can be permanently secured to circuit boards by means of its pin strip without a particularly great expense.

This object is realized in accordance with the invention in that at least between one row of pins which forms a signal plane and an adjoining row of pins which forms a ground plane there is spring-clamped a shield plate whose flanks are bent inwards and which thus contacts all the pins of the ground plane and which is insulated from the signal plane by an insulating film.

In an advantageous embodiment of the invention the inwards-bent flanks of the shield plate possess rectangular holes arranged in the same spacing as the contact pins.

Due to the fact that a shield plate is inserted between the rows of pins which convey the signals and the internal earth plane, the crosstalk from one signal line to another is substantially reduced. In this way it is possible to use all the pins for signal transmission without restricting regulations.

At its side flanks the shield plate is bent inwards and is provided with rectangular holes on these side flanks in the spacing of the rows of pins. These rectangular holes advantageously compensate the tolerances of the contacting edge with the row of pins which serves as the ground plane. A synthetic film arranged between the signal plane and the shield plate ensures that the required defined distance is maintained between shield plate and signal plane and simultaneously serves as a dielectric.

The concentration of the electrical field in the vicinity of the shield plate results in an overall reduction in cross-talk from one pin of the signal plane to another.

BRIEF DESCRIPTION OF THE DRAWING

A perspective view of the shielding system of the invention is illustrated in the drawing.

DESCRIPTION OF THE PREFERRED EMBODIMENTS

The FIGURE schematically illustrates the pin strip of the plug connector in accordance with the invention.

The interface for the signal transmission between two circuit boards in data processing systems consists of a three-row plug connector which is composed of a spring strip (not shown) which is arranged on the inter-plate line and of an angled pin strip 2 which is secured to the assembled circuit board 1. The pin strip 2 has three rows of pins 3, 4 and 5 mounted in an insulating strip, the two outer rows of pins 3 and 5 being provided for the signal transmission. The central row of pins 4 is connected to 0 volts (ground). The free, unscreened length of the outer row of signal pins 3 gives rise to crosstalk between the individual pins of this row 3. This crosstalk can be prevented by the insertion of a shield plate 6.

The shield plate 6 is a rectangular plate composed of tin-bronze whose flanks 7 are each bent inwards by approximately 150°. It is positioned between the rows of pins 3 and 4 on the solder terminal side of the pin strip 2. The rectangular flanks are thus in contact with the row of pins 3. The flanks 7 which are bent to approximately 150° contact the row of pins 4 which is connected to ground by means of their spring edges 8. Rectangular holes 9 are additionally provided at a short distance from the edge in the spacing of the contact pins in order to compensate tolerances of the contacting edges 8. An offset 10 provided at the beginning and at the end of the contacting edges facilitates the insertion of the shield plate between the rows of pins. A synthetic film 11 is arranged between the row 3 and the shield plate 2 and ensures that the required defined distance to the row 3 is maintained and simultaneously serves as a dielectric. The concentration of the electrical field in the vicinity of the shield plate substantially reduces the crosstalk between the signal pins of the row 3.

The shield plate itself can, for example, be designed for a three-row, 27-pole pin strip as shown here, which has a 2.54 mm graduation.

In accordance with the principle of the invention it is also possible to provide any other angled, multi-row pin strip possessing various numbers of poles and graduations with a shield plate. By breaking away the shield plate at determinate positions of the contacting edges, a central ground plane can also be interrupted.

The shield plate requires no special pin strip and can thus be subsequently installed or removed.

| List of References | |
|---|---|
| 1 | Circuit board |
| 2 | Pin strip |
| 3 | Rows of pins |
| 4 | " |
| 5 | " |
| 6 | Shield plate |
| 7 | Edges of shield plate |
| 8 | Contacting edges |
| 9 | Rectangular holes |
| 10 | Offset |
| 11 | Insulating film |

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A multi-row plug connector pin strip for transmitting small signals with low crosstalk in data processing systems, comprising: an insulating strip having mounted therein at least one row of pins which forms a signal plane and an adjacent row of pins which forms a ground plane; a shield plate spring-clamped in position between the two rows, edges of the shield plate being inwardly bent to contact all the pins of the ground plane row; and an insulating film on the shield plate between the signal plane row and the shield plate.

2. A pin strip as claimed in claim 1 wherein the inwardly bent edges of the shield plate have rectangular apertures arranged in correspondence with a spacing of the contact pins.

3. A pin strip as claimed in claim 1 wherein the bent edges of the shield plate themselves have an additional bent portion in a region of contacting areas.

4. A pin strip as claimed in claim 1 wherein the bent edges of the shield plate are two parallel edges of the plate.

5. A pin strip as claimed in claim 1 wherein all the pins are bent and the shield plate has a corresponding bend so as to follow a path of the pins.

6. A pin strip as claimed in claim 5 wherein two rows of signal plane pins are provided disposed on opposite sides of the ground plane row, pins of one of the signal plane rows being longer than pins of the other signal plane row between the insulating strip and a termination plane.

7. A pin strip of claim 6 wherein the termination plane comprises a circuit board.

8. A multi-row plug connector pin strip system for transmitting low level signals and minimizing crosstalk, comprising:
an insulating strip having first and second signal plane rows of pins carrying signals and a parallel ground plane row of pins carrying a reference potential between the first and second signal plane rows;
a pin path length of the first row requiring shielding being longer than a pin path length of the second row; and
a shield plate between the first row and the ground plane row, parallel edges of the plate being bent to contact the pins and provide a spring mounting for the shield plate, and means insulating the shield plate from the pins of the first row.

* * * * *